United States Patent [19]
Kinoshita et al.

[11] Patent Number: 5,856,218
[45] Date of Patent: Jan. 5, 1999

[54] BIPOLAR TRANSISTOR FORMED BY A HIGH ENERGY ION IMPLANTATION METHOD

[75] Inventors: Atsushi Kinoshita; Tomohisa Wada, both of Hyogo, Japan

[73] Assignee: Mitsubishi Denki Kabushiki Kaisha, Tokyo, Japan

[21] Appl. No.: 851,537

[22] Filed: May 5, 1997

Related U.S. Application Data

[62] Division of Ser. No. 572,431, Dec. 14, 1995, abandoned.

[30] Foreign Application Priority Data

Dec. 16, 1994 [JP] Japan ..................... 6-313524

[51] Int. Cl.[6] ........................... H01L 21/8238
[52] U.S. Cl. .................. 438/202; 438/208; 438/234; 438/370; 438/373; 438/414; 438/526; 257/370; 148/DIG. 9
[58] Field of Search .................. 257/370; 438/202, 438/208, 234, 414, 526, 370, 373, 160, 313; 148/DIG. 9

[56] References Cited

U.S. PATENT DOCUMENTS

| | | |
|---|---|---|
| 4,914,048 | 4/1990 | Scovell et al. ............ 438/202 |
| 4,927,776 | 5/1990 | Soejima ..................... 437/33 |
| 4,965,220 | 10/1990 | Iwasaki ..................... 437/59 |
| 4,987,089 | 1/1991 | Roberts ..................... 438/202 |
| 5,015,594 | 5/1991 | Chu et al. ................. 437/31 |
| 5,030,860 | 7/1991 | Tran . | |
| 5,147,818 | 9/1992 | Hikida ...................... 437/57 |
| 5,192,992 | 3/1993 | Kim et al. ................. 257/370 |
| 5,485,034 | 1/1996 | Maeda et al. . | |
| 5,495,120 | 2/1996 | Honda . | |

OTHER PUBLICATIONS

"Analysis and Design of Analog Integrated Circuits, Second Edition" by R.R. Gray and R.G. Meyer, pp. 81–105 (Nov. 30, 1990).

Primary Examiner—John Niebling
Assistant Examiner—Long Pham
Attorney, Agent, or Firm—McDermott, Will & Emery

[57] ABSTRACT

In an NPN bipolar transistor having a special structure in which each impurity region is formed by ion implantation, a width of a base region is significantly reduced, and therefore, current amplification factor hfe is increased, resulting in improvement in performance thereof. Furthermore, a Bi-CMOS transistor can be manufactured using a CMOS process. The use of the bipolar transistor having a special structure for a driving circuit allows implementation of a driving circuit having large driving force with slight increase in cost.

4 Claims, 8 Drawing Sheets

| INb | INc | w8 | w3 | w6 | w9 | w7 | w5 | w1 | OUT |
|-----|-----|----|----|-----|----|----|----|-----|------|
| H | H | L | H | ON | L | H | L | OFF | H |
| H | L | H | L | OFF | L | H | L | OFF | Hi-Z |
| L | H | H | L | OFF | H | L | H | ON | L |
| L | L | H | L | OFF | H | H | L | OFF | Hi-Z |

| INa | w10 | w11 | w12 | w13 | OUT |
|-----|-----|-----|-----|-----|-----|
| H | ON | OFF | L | OFF | L |
| L | OFF | ON | H | ON | H |

BIPOLAR TRANSISTOR FORMED BY A HIGH ENERGY ION IMPLANTATION METHOD

This application is a division of application Ser.No. 08/572,431 filed Dec. 14, 1995, now abandoned.

BACKGROUND OF THE INVENTION

1. Field of the Invention

The present invention relates to a semiconductor device, and more particularly, to a semiconductor device constituting a driving circuit using a bipolar transistor with a special structure.

2. Description of the Background Art

A structure of a bipolar transistor which has been known generally is disclosed in "Analysis and Design of Analog Integrated Circuits, Second Edition" by Raul R. Gray and Robert G. Meyer.

FIG. 8A is a plan showing a conventional bipolar transistor described in the above mentioned document, and FIG. 8B is a cross section thereof.

Referring to FIGS. 8A and 8B, in the conventional bipolar transistor, a P type semiconductor substrate 51 is prepared, and a high concentration N type region 52 is formed therein. Then, a low concentration N type region 53 is formed at a main surface of semiconductor substrate 51 by epitaxial growth. Then, a P type base region 59, and high concentration N type regions 60 and 62 which will be emitter and collector regions, respectively, are formed. Thereafter, a metal electrode 63 is connected to each of the emitter, the base and the collector, constituting a bipolar transistor.

FIG. 9B is a diagram showing an impurity concentration profile in the direction of the section A—A' (see FIG. 9A) of the conventional bipolar transistor shown in FIGS. 8A and 8B.

FIG. 9A shows where the section A—A' is located in the bipolar transistor, and FIG. 9B shows an impurity concentration at each location along the section A—A'. An example in which an impurity concentration in collector region 53 formed by epitaxial growth is $1 \times 10^{15} [\text{cm}^{-3}]$ is shown here. High concentration N type region 52 has such a profile as illustrated in the figure.

FIG. 10A is a cross section showing a bipolar transistor having no high concentration buried region, and Fig. 10B is a diagram showing an impurity concentration profile in the direction of the section B—B' of the bipolar transistor as shown in Fig. 10A.

Referring to FIGS. 10A and 10B, a bipolar transistor in this case is formed by diffusion of impurities from a surface of a substrate without using epitaxial growth. Fig. 10B is a diagram showing an impurity concentration corresponding to the depth of each diffusion layer with the abscissa indicating the depth along the section B—B' of the bipolar transistor shown in FIG. 10A and the ordinate indicating an impurity concentration.

Referring to FIG. 10B, the collector has lower concentration than that of a surface (background) of the substrate in a deeper portion of the substrate of this bipolar transistor. Therefore, as described in the above mentioned document (page 86 lines 1–3), collector resistance is increased and the breakdown voltage between the collector and the emitter is reduced, resulting in the delay of the operation.

On the other hand, in the bipolar transistor having high concentration N type region 52 shown in FIGS. 9 A and 9 B, epitaxial growth of the substrate is required, causing significant increase in cost for the semiconductor substrate. Accordingly, a driving circuit constituted by this bipolar transistor is expensive, resulting in increase in the cost for a semiconductor device including the driving circuit.

SUMMARY OF THE INVENTION

It is therefore one object of the present invention to provide a semiconductor device constituting a driving circuit having large driving force, which produces only a slight increase in cost from the cost for a CMOS process.

It is another object of the present invention to provide a method of manufacturing a semiconductor device constituting a driving circuit having large driving force, which produces only a slight increase in cost from the cost for the CMOS process.

It is a further object of the present invention to provide a Bi-CMOS which produces only a slight increase in cost from the cost for the CMOS process.

A semiconductor device according to the present invention is a bipolar transistor including a semiconductor substrate of a first conductivity type having a main surface, a collector layer of a second conductivity type formed at the main surface of the semiconductor substrate by ion implantation, a base layer of a first conductivity type formed at a surface of the collector layer by ion implantation, and an emitter layer of a second conductivity type formed at a surface of the base layer by ion implantation. The collector layer is connected to a first potential, the base layer is connected to an input terminal, and the emitter layer is connected to an output terminal, whereby the bipolar transistor constitutes a driving circuit.

Since each impurity region of the bipolar transistor is formed by ion implantation, width of the base region can be reduced significantly. Consequently, performance of the bipolar transistor can be improved significantly, while maintaining increase in cost from the cost for the CMOS process small. In addition, reduction in cost can be achieved compared to the case of using a normal bipolar transistor manufactured by the process including epitaxial growth.

Preferably, a CMOS transistor is formed adjacent to the bipolar transistor at the main surface of the semiconductor substrate. Accordingly, a Bi-CMOS can be manufactured by the process in which only the step of implanting ions into the whole surface of the substrate for formation of the base region is added to the CMOS process, achieving implementation of a Bi-CMOS process producing only a slight increase in cost from the cost for the CMOS process.

As a result, a semiconductor device constituting a driving circuit having large driving force, which produces only a slight increase in cost from the cost for the CMOS process, can be realized.

According to another aspect of the present invention, a method of manufacturing a semiconductor device includes the steps of preparing a semiconductor substrate of a first conductivity type having a main surface; forming first and second impurity regions of a second conductivity type spaced apart from each other at the main surface of the substrate by ion implantation; forming a third impurity region of a first conductivity type between the first and the second impurity regions of a second conductivity type at the main surface of the substrate; forming first and second gate electrodes on a main surface of the second impurity region of a second conductivity type and on a main surface of the third impurity region of a first conductivity type, respectively, with an insulating film interposed therebetween; forming a fourth impurity region of a first conductivity type in the second impurity region of a second conductivity type by ion implantation using the first gate electrode as a mask; forming a fifth impurity region of a second conductivity type in the third impurity region of a first conductivity type by ion implantation using the second gate electrode as a mask; forming a sixth impurity region of a first conductivity type at a portion of a main surface of the first impurity region of a second conductivity type by ion implantation; and forming a seventh impurity region of a second conductivity type at a portion of a main surface of the sixth impurity region of a first conductivity type by ion implantation. Thus, a bipolar transistor is formed by the sixth impurity region of a first conductivity type, the seventh impurity region of a second conductivity type and the first impurity region of a second conductivity type.

Since a bipolar transistor is formed only by ion implantation from the main surface of the semiconductor substrate, a method of manufacturing a semiconductor device having large driving force, which produces only a slight increase in cost from the cost for the CMOS process, can be provided.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described in conjunction with the accompanying drawings.

Figure 1A:
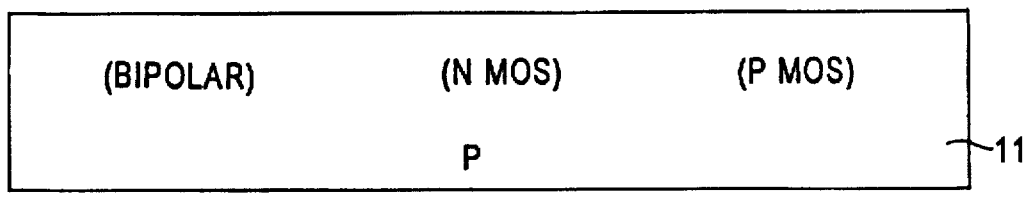
FIGS. 1 A to 1 E are cross sections sequentially showing the structure of a Bi-CMOS transistor which is a base of a semiconductor device in accordance with an embodiment of the present invention.
Figure 1B:
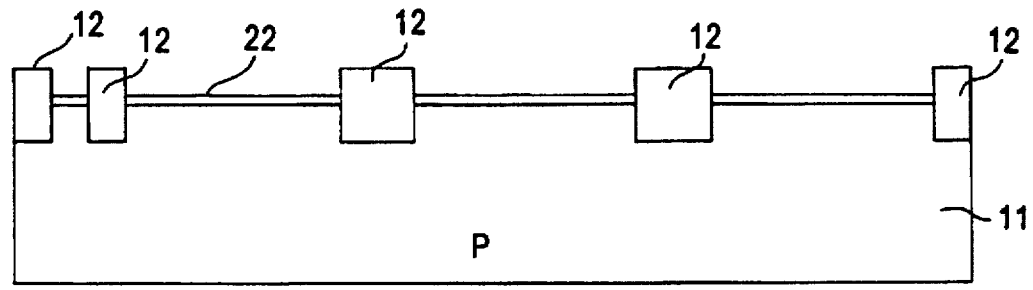
Figure 1C:
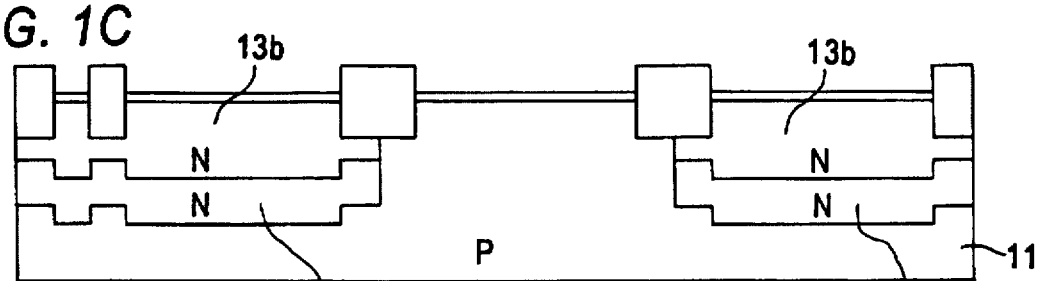
Figure 1D:
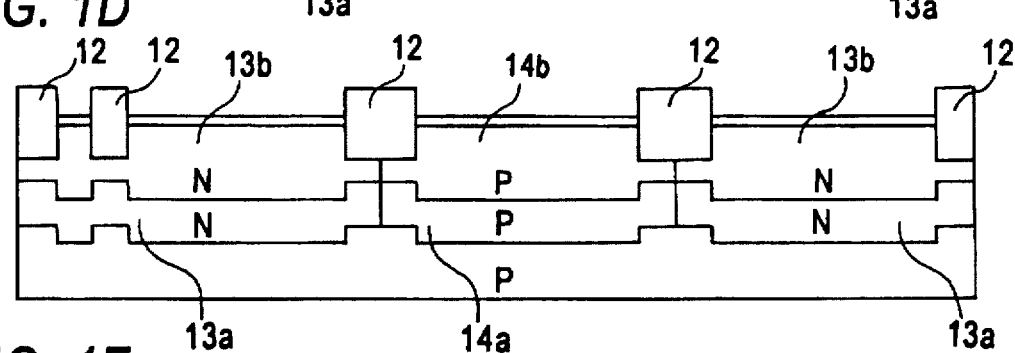
Figure 1E:
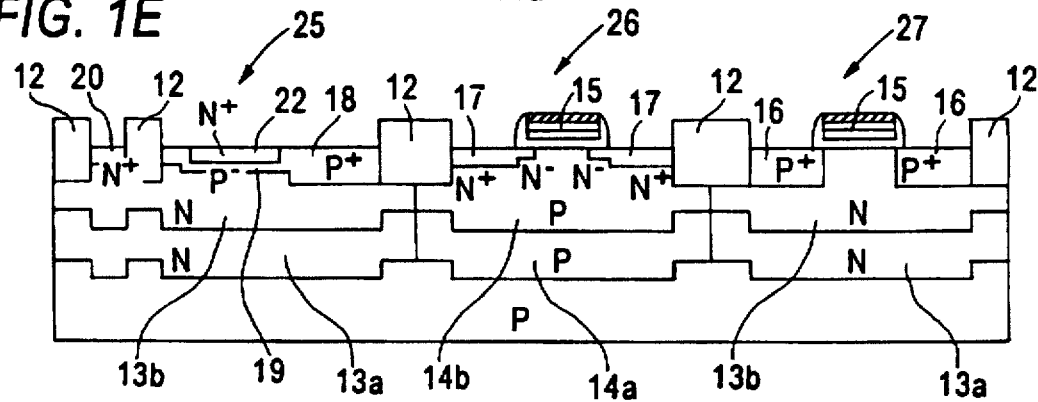

Referring to FIGS. 1A to 1E, a P type semiconductor substrate 11 is first prepared (FIG. 1A). Then, an isolation oxide film 12 and a gate oxide film 22 are formed at a main surface of P type semiconductor substrate 11. Referring to FIG. 1 B, ions are implanted at a high energy of 1–4 MeV into a region where a PMOS transistor 27 and an NPN bipolar transistor 25 are to be formed, whereby N type well regions 13a and 13b are formed. At this time, these N type well regions are formed so that lower N type well region 13a has higher concentration than upper N type well region 13b. Referring to FIG. 1D, ions are implanted similarly at a high energy into a region where an NMOS transistor 26 is to be formed, thereby forming P type well regions 14a and 14b. Referring to FIG. 1E, after impurities are implanted into a conductive channel portion of each MOS transistor and a threshold voltage of the MOS transistor is adjusted, a gate electrode 15 of the MOS transistor is formed. Then, an N type source/drain region 17, an N$^+$ layer 20 at a collector electrode junction of the bipolar transistor, and an N$^+$ layer 22 at an emitter electrode junction are formed simultaneously using gate electrode 15 as a mask.

FIGS. 2 A and 2 B are cross sections illustrating in detail the manufacturing process of FIG. 1E.

Referring to FIG. 2 A, a region where NMOS transistor 26 is to be formed and a region where bipolar transistor 25 is to be formed are masked with a resist layer 21 except a P$^+$ layer 18 at a base electrode junction. Then, a source/drain region 16 of PMOS transistor 27 and P$^+$ layer 18 at the base electrode junction of bipolar transistor 25 are formed simultaneously by ion implantation of P type impurities such as boron. Thereafter, ions are implanted into the whole surface, whereby a low concentration P$^-$ layer of a base of bipolar transistor 25 is formed.

Figure 9A:
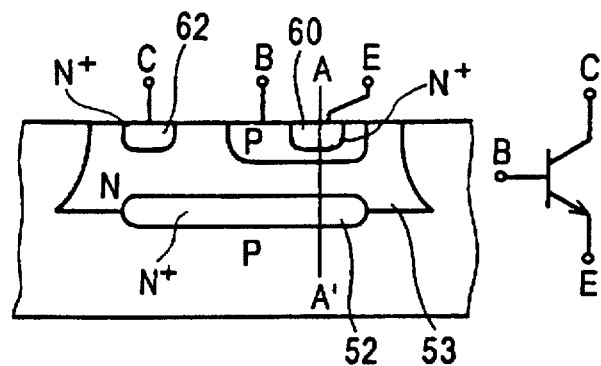
FIGS. 9 A and 9 B are diagrams showing an impurity concentration profile in the direction of the section A—A' of the conventional bipolar transistor shown in FIG. 8, wherein FIG. 9 A shows where the section A—A' is located in the bipolar transistor, and FIG. 9 B shows impurity concentration along the section A—A'.
Figure 9B:
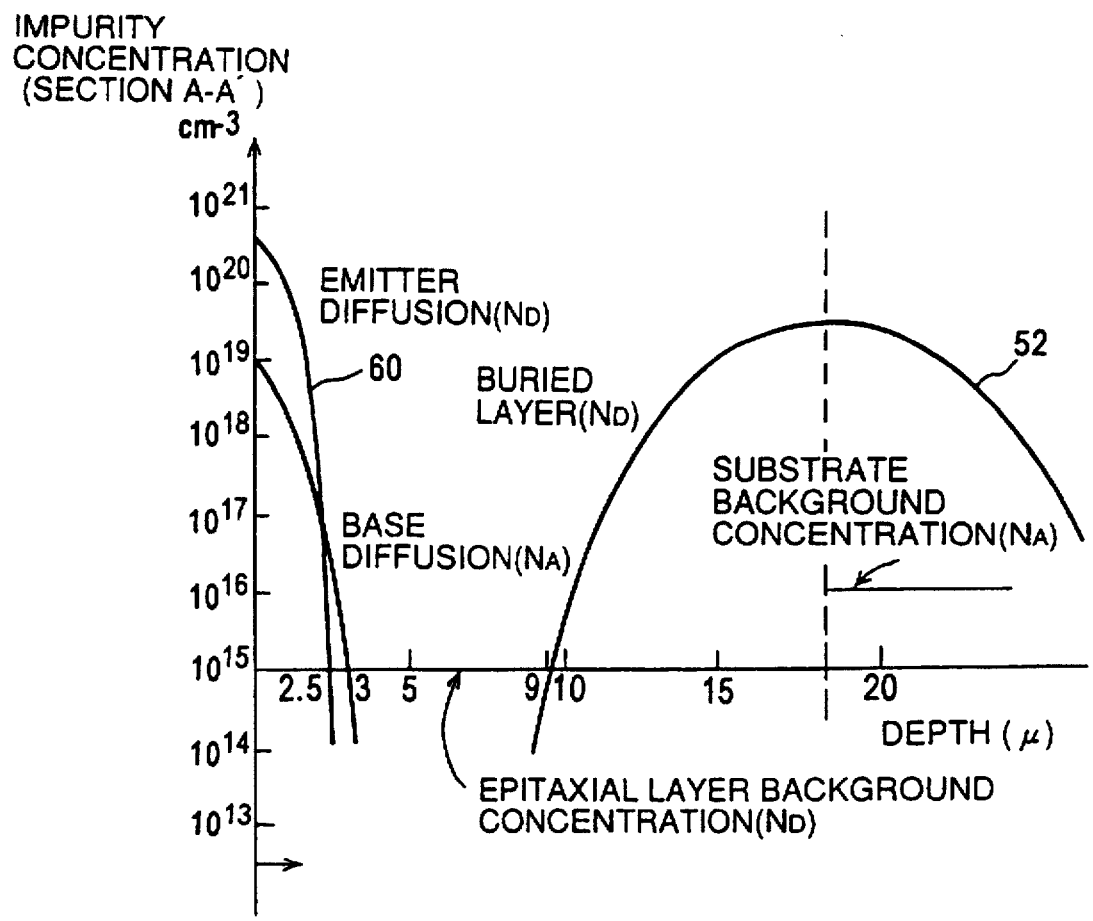
Figure 10A:
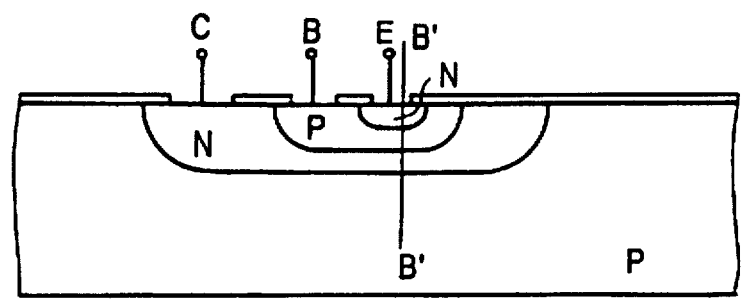
FIG. 10 A is a cross section showing a conventional bipolar transistor having no high concentration buried region, and FIG. 10 B is a diagram showing an impurity concentration profile in the direction of the section B—B'of the bipolar transistor shown in FIG. 1A
Figure 10B:
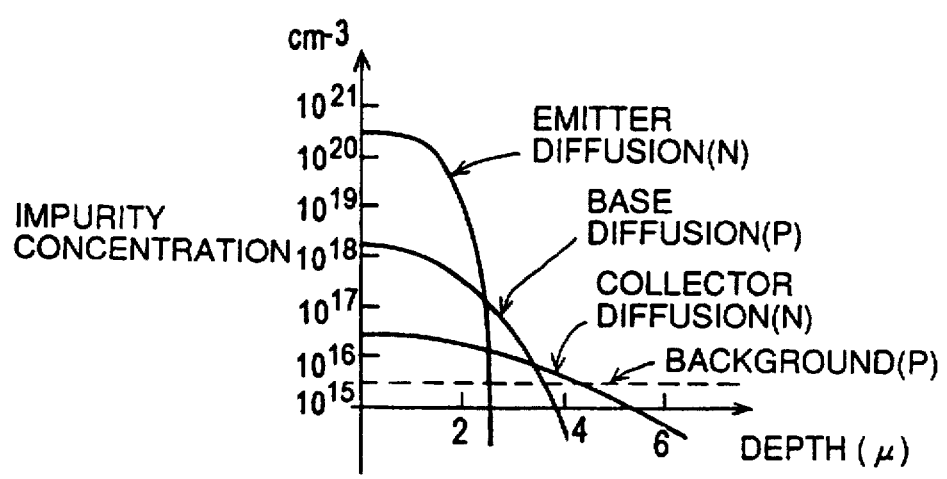

Thus, a Bi-CMOS (Bipolar Complementary Metal Oxide Semiconductor) can be formed by such a process as described above in which only the step of implanting P$^+$ ions into the whole surface to form a base region is added to the CMOS process, achieving implementation of a Bi-CMOS transistor having slight increase in cost from the cost for the CMOS transistor. In addition, according to this manufacturing process, a collector is formed by a high energy ion implantation method, and therefore, increase in collector resistance and reduction in breakdown voltage between the collector and the emitter can be improved over the conventional bipolar transistor shown in FIGS. 10 A and 10 B. Furthermore, since the step of epitaxial growth as required for the conventional bipolar transistor shown in FIGS. 9 A and 9 B is not necessary, manufacturing cost of a wafer can be reduced.

FIG. 3 A is a cross section showing a conventional bipolar transistor, and FIG. 3 B is a cross section showing only an NPN bipolar transistor region having a special structure out of the Bi-CMOS transistor shown in FIG. 1E, in which a metal interconnection 33 is connected as a base electrode, a collector electrode and an emitter electrode.

Figure 3A:
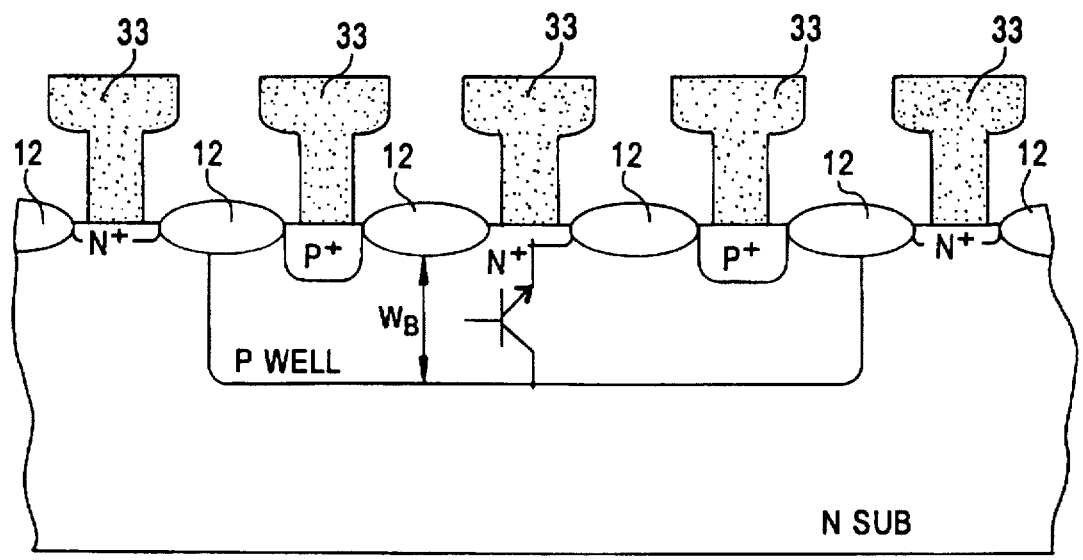
FIG. 3 A is a cross section of a conventional bipolar transistor, and FIG. 3 B is a cross section showing a bipolar transistor with a special structure which is used for a driving circuit in accordance with the present invention.

Referring to FIG. 3A, in the conventional bipolar transistor, a P well of a base region is formed at a surface of an N type substrate (Nsub) of a collector region, a P$^+$ layer and an N$^+$ layer of an emitter region are selectively formed at a surface of the P well by an isolation oxide film 12, and a metal electrode 33 is connected thereto.

Figure 2A:
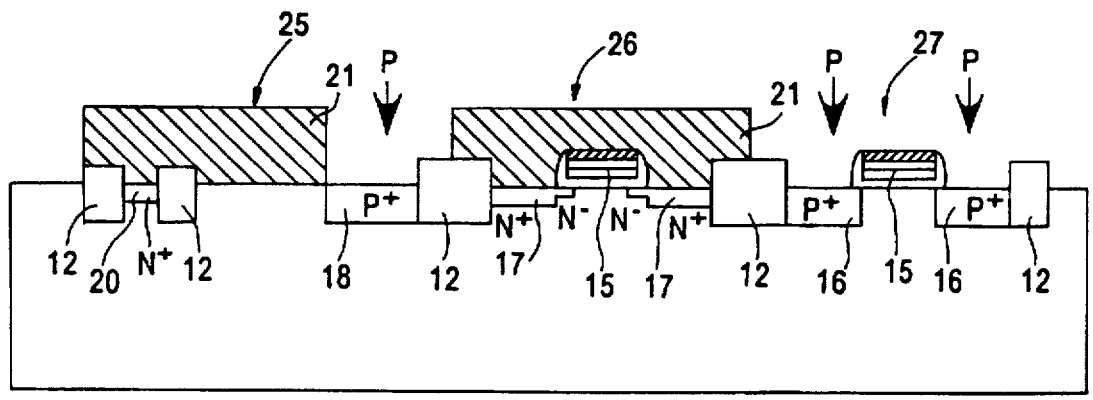
FIGS. 2 A and 2 B are cross sections sequentially showing the structure of a Bi-CMOS transistor which is a base of a semiconductor device in accordance with an embodiment of the present invention.
Figure 2B:
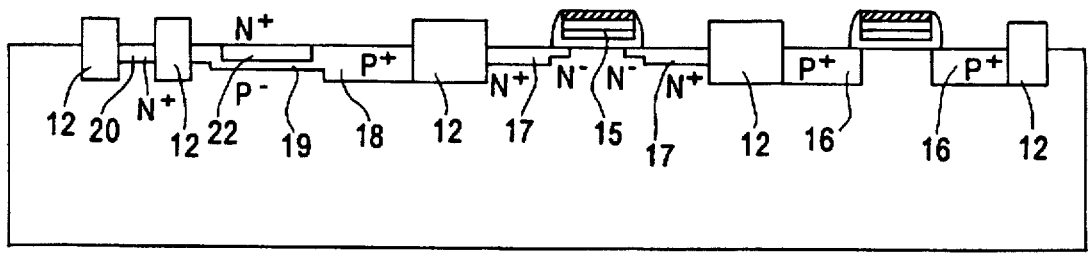
Figure 3B:
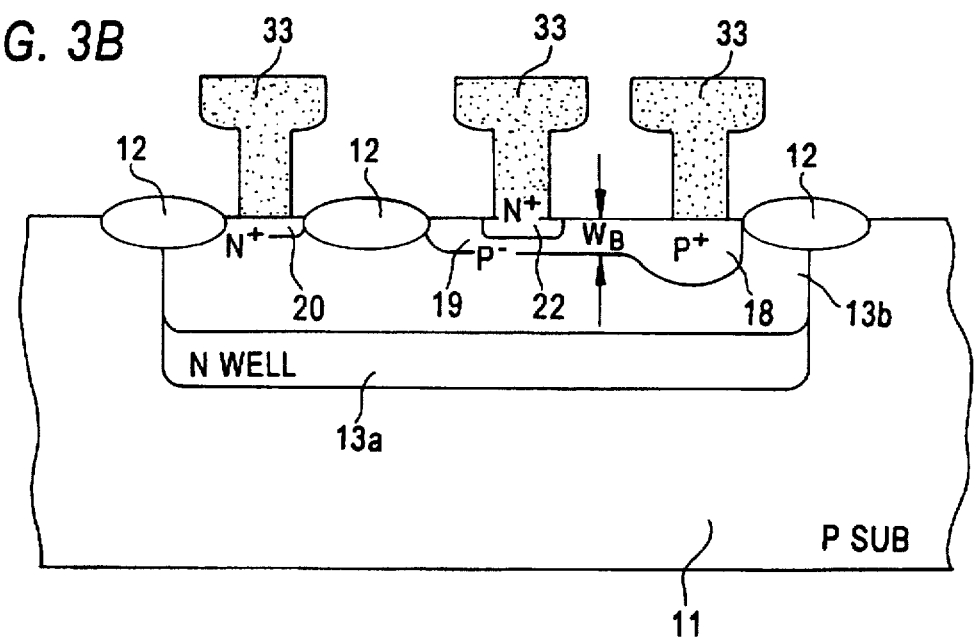

Referring to FIG. 3B, a width W$_B$ (about a depth of the P well>1 μm) of the base region of the conventional bipolar transistor shown in FIG. 3A can be significantly reduced to at most 0.3 μm by the manufacturing process using ion implantation shown in FIGS. 1 and 2A—2B.

Normally, the current amplification factor hfe is included in the performance indexes of a bipolar transistor. This current amplification factor is defined by the rate of collector current $I_C$, to base current $I_B$, and is normally about 100. The current amplification factor hfe expressed by device parameters such as impurity concentration and diffusion constant results in the equation (1) as follows.

$$hfe = 1/W((W_B^2/2\tau b) + (D_P/D_N)*(W_B/L_P)*(N_A/N_D)) \quad (1)$$

Where $W_B$ is a base width, τb is a life time of minority carriers in the base, $D_P$ is a diffusion constant of holes in the emitter, $D_N$ is a diffusion coefficient of electrons in the base, $L_P$ is a hole diffusion length, $N_A$ is an impurity concentration in the base, and $N_D$ is an impurity concentration in the emitter. As can be seen from the equation (1), reduction in the base width $W_B$ results in increase in the current amplification factor hfe. Accordingly, performance of a bipolar transistor can be improved significantly.

Figures 4, 5:
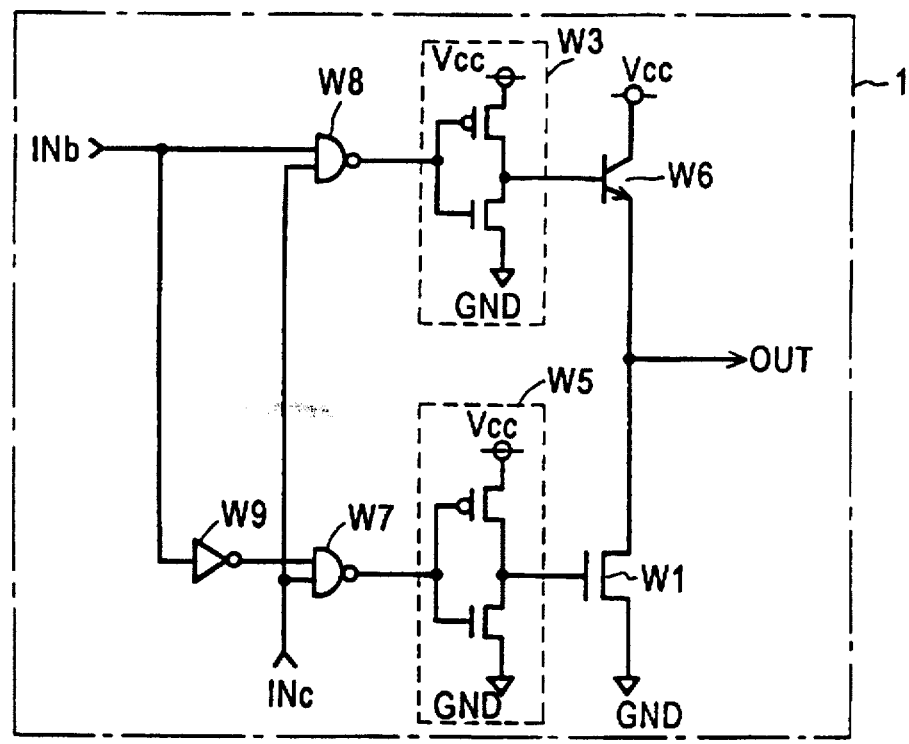
FIG. 4 is a circuit diagram showing a driving circuit 1 using a bipolar transistor with a special structure in which each impurity region is formed by ion implantation in accordance with an embodiment of the present invention.
FIG. 5 is a diagram showing logic values of the driving circuit 1 in accordance with an embodiment of the present invention.

FIG. 4 is a circuit diagram showing a driving circuit 1 using a bipolar transistor with a special structure in which each impurity region is formed by ion implantation in accordance with an embodiment of the present invention.

Referring to FIG. 4, driving circuit 1 includes an NMOS transistor w1, inverters w3, w5 and w9, NAND circuits w7 and w8, and an NPN bipolar transistor w6 having a special structure.

Two inputs of NAND circuit w8 are connected to input terminals INb and INc, respectively. An input of inverter w3 is connected to an output of NAND circuit w8, and an output of invert w3 is connected to a base electrode of bipolar transistor w6. A collector electrode of bipolar transistor w6 is connected to a power supply potential Vcc, and an emitter electrode thereof is connected to a source electrode of NMOS transistor w1 and an output terminal OUT.

An input of inverter w9 is connected to input terminal INb. Two inputs of NAND circuit w7 are connected to an output of inverter w9 and input terminal INc, respectively. An input of inverter w5 is connected to an output of NAND circuit w7, and an output of inverter w5 is connected to the gate of NMOS transistor w1. A drain electrode of NMOS transistor w1 is grounded (GND).

FIG. 5 is a diagram showing logic values of driving circuit 1. Driving circuit 1 supports a tristate.

Referring to FIG. 5, when inputs from input terminals INb and INc are both at a high level, a signal at a high level is first input to each of two inputs of NAND circuit w8. Then, a signal at a low level is output from NAND circuit w8 to inverter w3. Since an input of inverter w3 is at a low level, a PMOS transistor of inverter w3 turns ON and an output of inverter w3 attains a high level, whereby current flows into the base electrode of bipolar transistor w6, and bipolar transistor w6 turns ON, as a result.

On the other hand, a signal at a high level is input from input terminal INb to inverter w9. A signal at a low level output from inverter w9 and a signal at a high level from input terminal INc are input to two inputs of NAND circuit w7, respectively. Since a signal at a high level is output from NAND circuit w7 to inverter w5 and a signal at a low level is output from inverter w5 to a gate electrode of NMOS transistor w1, NMOS transistor w1 is OFF. Accordingly, since bipolar transistor w6 is ON and NMOS transistor w1 is OFF and only an output signal of bipolar transistor w6 is pulled up in driving circuit 1, a signal at a high level which has dropped from power supply potential Vcc by base-emitter junction voltage is output to output terminal OUT through bipolar transistor w6.

When an input from input terminal INb is at a high level and an input from input terminal INc is at a low level, the signal at a high level from input terminal INb and the signal at a low level from input terminal INc are first input to two inputs of NAND circuit w8, respectively. A signal at a high level is output from NAND circuit w8 to inverter w3. Since an input of inverter w3 is at a high level, an NMOS transistor of inverter w3 turns ON, and an output of inverter w3 attains a low level and is input to a gate electrode of bipolar transistor w6, whereby bipolar transistor w6 is OFF.

On the other hand, a signal at a high level is input from input terminal INb to inverter w9. A signal at a low level output from inverter w9 and a signal at a low level from input terminal INc are input to two inputs of NAND circuit w7, respectively. Since a signal at a high level is output from NAND circuit w7 to inverter w5 and a signal at a low level is output from inverter w5 to the gate of NMOS transistor w1, NMOS transistor w1 is OFF.

Therefore, both bipolar transistor w6 and NMOS transistor w1 are OFF, whereby a signal in a high impedance state (hi-Z) is output to output terminal OUT.

When an input from input terminal INb is at a low level and an input from input terminal INc is at a high level, the signal at a low level from input terminal INb and the signal at a high level from input terminal INc are first input to two inputs of NAND circuit w8. A signal at a high level is output from NAND circuit w8 to inverter w3. Since a signal at a low level is output from inverter w3 to a base electrode of bipolar transistor w6, bipolar transistor w6 is OFF.

On the other hand, a signal at a low level is input from input terminal INb to inverter w9. A signal at a high level output from inverter w9 and a signal at a high level from input terminal INc are input to two inputs of NAND circuit w7, respectively. Since a signal at a low level is input from NAND circuit w7 to inverter w5 and a signal at a high level is then output from inverter w5 to a gate electrode of NMOS transistor w1, NMOS transistor w1 is ON.

Therefore, since bipolar transistor w6 is OFF and NMOS transistor w1 is ON, a signal at a low level is output.

Finally, when inputs from input terminals INb and INc are both at a low level, signals at a low level are first input to two inputs of NAND circuit w8, respectively Then, a signal at a high level is output from NAND circuit w8 to inverter w3. Since a signal at a low level is output from inverter w3 to a base electrode of bipolar transistor w6, bipolar transistor w6 is OFF.

On the other hand, a signal at a low level is input from input terminal INb to inverter w9. A signal at a high level output from inverter w9 and a signal at a low level from input terminal INc are input to two inputs of NAND circuit w7, respectively. Since a signal at a high level is output from NAND circuit w7 to inverter w5 and a signal at a low level is then output from inverter w5 to a gate electrode of NMOS transistor w1, NMOS transistor w1 is OFF.

Accordingly, both bipolar transistor w6 and NMOS transistor w1 are OFF, whereby a signal in a high impedance state (Hi-Z) is output to output terminal OUT.

Figures 6, 7:
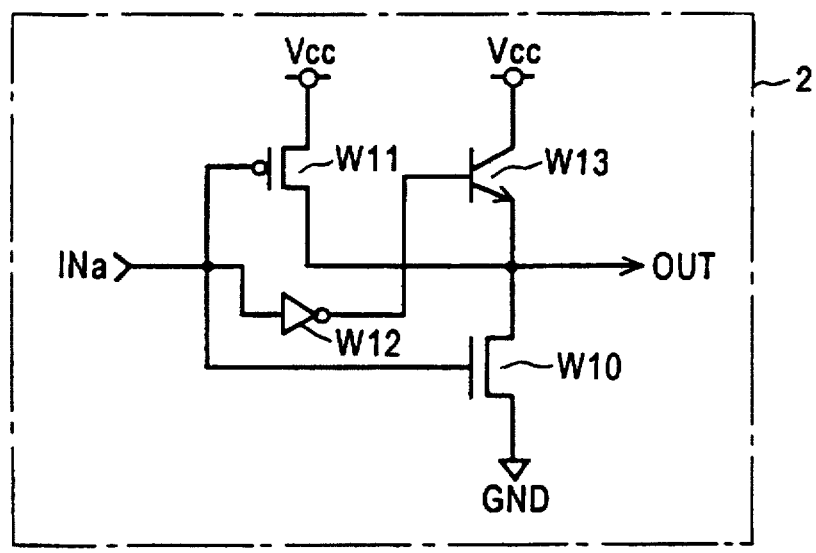
FIG. 6 is a circuit diagram showing a driving circuit 2 using a bipolar transistor with a special structure in which each impurity region is formed by ion implantation in accordance with an embodiment of the present invention.
FIG. 7 is a diagram showing logical values of the driving circuit 2 in accordance with an embodiment of the present invention.
Figure 8A:
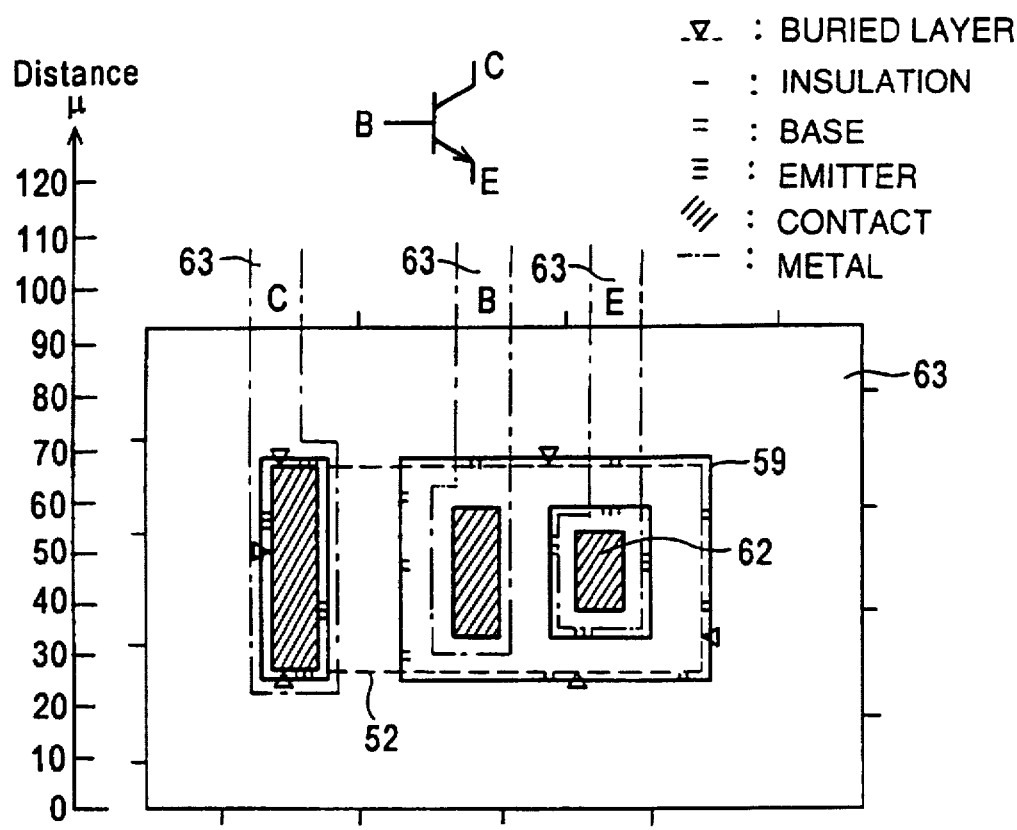
FIG. 8 A is a plan showing a conventional bipolar transistor, and FIG. 8 B is a cross section thereof.
Figure 8B:
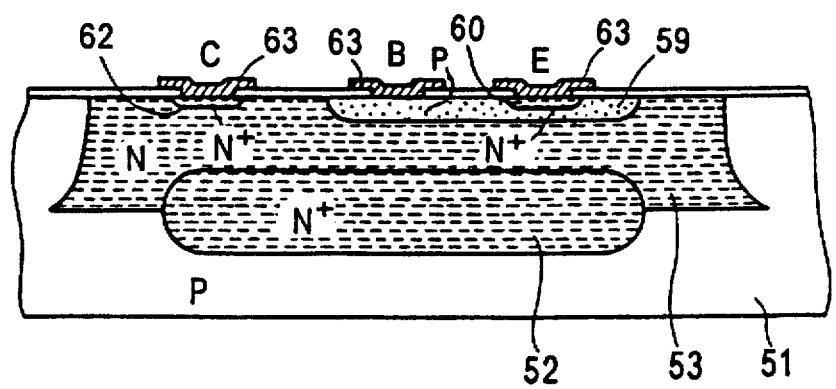

FIG. 6 is a circuit diagram showing a driving circuit 2 using a bipolar transistor with a special structure in which each impurity region is formed by ion implantation in accordance with an embodiment of the present invention. Referring to FIG. 6, driving circuit 2 includes an NMOS transistor w10, a PMOS transistor w11, an inverter w12, and an NPN bipolar transistor w13 having a special structure.

A gate electrode of PMOS transistor wil is connected to an input terminal INa, a source electrode thereof is connected to a power supply potential Vcc, and a drain electrode thereof is connected to a source electrode of NMOS transistor w10 and an output terminal OUT. An input of inverter w12 is connected to input terminal INa and an output thereof is connected to a base electrode of bipolar transistor w13. A collector electrode of bipolar transistor w13 is connected to power supply potential Vcc, and an emitter electrode thereof is connected to the source electrode of NMOS transistor w10 and output terminal OUT. A gate electrode of NMOS transistor w10 is connected to input terminal INa, and a drain electrode thereof is grounded (GND).

FIG. 7 is a diagram showing logic values of driving circuit 2. A tristate is not supported in driving circuit 2.

Referring to FIGS. 6 and 7, when an input from input terminal INa is at a high level, an output of inverter w12 is at a low level and bipolar transistor w13 is OFF. However, since NMOS transistor w10 turns ON, an output from output terminal OUT is at a low level. When an input from input terminal INa is at a low level, NMOS transistor w10 is OFF and PMOS transistor w11 is ON, and therefore, power supply potential Vcc is output to output terminal OUT. In addition, since inverter w12 causes current to flow into a base electrode of bipolar transistor w13, bipolar transistor w13 turns ON, whereby a signal at a level which has dropped from power supply potential Vcc by base-emitter junction voltage is also output through bipolar transistor w13.

In other words, in the case of this driving circuit 2, when input terminal INa outputs a signal at a low level and output terminal OUT outputs a signal at a high level, both PMOS transistor w11 and bipolar transistor w13 are ON so long as a signal of output terminal OUT is at a level lower than that of a voltage which has dropped from power supply potential Vcc by the base-emitter junction voltage (Vcc-VBE), and therefore, the driving circuit shows large driving force. However, when the signal of output terminal OUT is at a level of Vcc-VBE or higher, only PMOS transistor w11 is ON, resulting in reduction in driving force of the circuit.

As has been described above, a bipolar transistor having a special structure in which each impurity region is formed by ion implantation has an improved performance, and therefore, the use of the bipolar transistor makes it possible to implement a semiconductor device constituting a driving circuit with large driving force while suppressing increase in cost from the cost for the CMOS process.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

providing a semiconductor substrate of a first conductivity type having a main surface;

forming first and second impurity regions of a second conductivity type spaced apart from each other at said main surface by ion implantation;

forming a third impurity region of said first conductivity type between said first and second impurity regions of a second conductivity type at said main surface;

forming first and second gate electrodes on respective main surfaces of said second impurity region and said third impurity region with an insulating film interposed therebetween;

forming a fourth impurity region of said first conductivity type at the main surface of said second impurity region by ion implantation using said first gate electrode as a mask;

forming a fifth impurity region of said second conductivity type at the main surface of said third impurity region by ion implantation using said second gate electrode as a mask;

forming a sixth impurity region of a first conductivity type at a portion of the main surface of said first impurity region by ion implantation; and forming a seventh impurity region of a second conductivity type at a portion of a main surface of said sixth impurity region by ion implantation, whereby a bipolar transistor is constituted by said sixth impurity region, said seventh impurity region, and said first impurity region.

2. The method of manufacturing a semiconductor device according to claim 1, further comprising the step of:

forming an eighth impurity region of a second conductivity type having higher concentration than said first impurity region of a second conductivity type at the main surface of said first impurity region by ion implantation, wherein said eighth impurity region of a second conductivity type and said fifth impurity region of a second conductivity type are formed in a same step.

3. The method of manufacturing a semiconductor device according to claim 1, wherein said sixth impurity region of a first conductivity type and said fourth impurity region of a first conductivity type are formed in a same step.

4. The method of manufacturing a semiconductor device according to claim 1, wherein said steps of forming an impurity region by ion implantation includes the step of forming an impurity region by a high energy ion implantation method.

* * * * *